United States Patent
Van Den Heijkant et al.

(10) Patent No.: US 10,284,801 B2
(45) Date of Patent: May 7, 2019

(54) DIFFERENTIAL DIGITAL DOUBLE SAMPLING METHOD AND CMOS IMAGE SENSOR FOR PERFORMING SAME

(71) Applicant: GVBB HOLDINGS S.A.R.L., Luxembourg (LU)

(72) Inventors: Juul Josephus Johannes Van Den Heijkant, Breda (NL); Jeroen Rotte, Breda (NL); Petrus Gijsbertus Centen, Goirle (NL)

(73) Assignee: GVBB HOLDINGS S.A.R.L., Luxembourg (LU)

( * ) Notice: Subject to any disclaimer, the term of this patent is extended or adjusted under 35 U.S.C. 154(b) by 0 days.

(21) Appl. No.: 15/690,034

(22) Filed: Aug. 29, 2017

(65) Prior Publication Data

US 2018/0070035 A1 Mar. 8, 2018

Related U.S. Application Data

(60) Provisional application No. 62/385,027, filed on Sep. 8, 2016.

(51) Int. Cl.
*H04N 5/374* (2011.01)
*H04N 5/3745* (2011.01)
(Continued)

(52) U.S. Cl.
CPC ....... *H04N 5/374* (2013.01); *H01L 27/14614* (2013.01); *H01L 27/14643* (2013.01);
(Continued)

(58) Field of Classification Search
CPC ............... H04N 5/374; H04N 5/37457; H04N 5/37452; H04N 5/363; H04N 5/378;
(Continued)

(56) References Cited

U.S. PATENT DOCUMENTS

2007/0235631 A1* 10/2007 Ladd .................... H04N 5/3575
250/208.1
2014/0263964 A1* 9/2014 Yang ...................... H04N 5/347
250/208.1
(Continued)

FOREIGN PATENT DOCUMENTS

JP 2010268529 A 11/2010

OTHER PUBLICATIONS

International Search Report & Written Opinion issued in PCT/EP2017/072125 dated Nov. 13, 2017.

*Primary Examiner* — Shahbaz Nazrul
(74) *Attorney, Agent, or Firm* — Arent Fox LLP

(57) ABSTRACT

A method for performing differential double sampling and a CMOS image sensing device for performing the same. In one example, the CMOS image sensing device includes a pixel array include a multitude of pixels with each pixel formed by a plurality of photodiodes, a floating diffusion point and a plurality of transistors electrically coupled the plurality of photodiodes. Moreover, a column readout circuit with four storage capacitors is selectively coupled to the pixel array by switches so that the storage capacitors can store sampled pixel values. A control circuit connected to the pixel array and the column readout circuit selectively activates the transistors to output to the column readout circuit sampled dark value and bright values of one photodiode and a sampled double bright value of the one photodiode and one additional photodiode.

27 Claims, 14 Drawing Sheets

(51) Int. Cl.
*H01L 27/146* (2006.01)
*H04N 5/363* (2011.01)
*H04N 5/378* (2011.01)
*H04N 5/357* (2011.01)
*H04N 5/345* (2011.01)
*H04N 5/376* (2011.01)

(52) U.S. Cl.
CPC ......... *H04N 5/3452* (2013.01); *H04N 5/3575* (2013.01); *H04N 5/363* (2013.01); *H04N 5/378* (2013.01); *H04N 5/37452* (2013.01); *H04N 5/37457* (2013.01); *H04N 5/3765* (2013.01); *H04N 5/37455* (2013.01)

(58) Field of Classification Search
CPC .. H04N 5/3575; H04N 5/3452; H04N 5/3765; H04N 5/37455; H01L 27/14614; H01L 27/14643
See application file for complete search history.

(56) References Cited

U.S. PATENT DOCUMENTS

| | | | |
|---|---|---|---|
| 2015/0215555 A1* | 7/2015 | Iwane | H04N 5/378 348/301 |
| 2016/0014358 A1* | 1/2016 | Itoh | H04N 5/378 348/294 |
| 2016/0165159 A1* | 6/2016 | Hseih | H04N 5/23235 348/273 |

* cited by examiner

DIFFERENTIAL DIGITAL DOUBLE SAMPLING METHOD AND CMOS IMAGE SENSOR FOR PERFORMING SAME

CROSS-REFERENCE TO RELATED APPLICATIONS

The current application claims priority to U.S. Patent Provisional Application No. 62/385,027, filed Sep. 8, 2016, the entire contents of which are hereby incorporated by reference.

TECHNICAL FIELD

The disclosure herein generally relates to CMOS images sensors, and, more particularly, to a method for performing differential double sampling and a CMOS image sensor for performing the same.

BACKGROUND

Complementary metal oxide semiconductor ("CMOS") image sensors are widely used in digital cameras to produce digital images by converting optical signals into electrical signals. In operation, CMOS image sensors convert an optical signal into an electrical signal using a multitude of pixels that each include a photodiode and a read-out circuit. The photodiode generates electric charges using absorbed light, converts the generated electric charges into an analog current, and delivers the analog current to the read-out circuit. The read-out circuit converts the analog signal into a digital signal and outputs the digital signal.

Certain CMOS image sensor pixel circuits are formed using four transistors and are known and referred to as 4T image sensor pixels or "4T pixels." FIG. 1 illustrates a typical design of a 4T pixel 10 connected to a bitline 20. As shown, the 4T CMOS image sensor pixel 10 includes a photodiode ("PD") that provides the photon to electron conversion, while a floating diffusion ("FD") point provides the electron to voltage conversion. The voltage per electron conversion of the FD is known as conversion gain ("CG") and is an important parameter for CMOS image sensors. Conversion gain boosts the pixel signal relative to the analog noise, thereby reducing the noise floor, and thereby enabling performance at lower light levels.

For such CMOS image sensors, during the analog-to-digital conversion process, a comparator receives an analog voltage and compares the analog voltage with a ramp voltage. In one implementation of a CMOS image sensor, the comparator compares the analog voltage with the ramp voltage, and uses a counter to count until the ramp voltage is greater than an analog voltage. Once the counter stops counting, a count value is digital data corresponding to an analog voltage, that is, the count value is the digital data into which the analog voltage has been converted.

In any event, it is understood to those skilled in the art that an up-down counter is typically used to perform digital double sampling ("DDS"). DDS means obtaining a difference ($D_{sig}-D_{rst}$) between digital data $D_{rst}$ obtained by converting a first analog signal output by an initialized pixel into digital data, and digital data $D_{sig}$ obtained by converting a second analog signal received from the pixel that has received an external image signal into digital data, wherein the second analog signal corresponds to the external image signal. Referring to FIG. 1, the pixel is reset when the reset transistor ("RST") and transfer gate ("TG") are turned on simultaneously, setting both the floating diffusion FD and the photodiode PD to the VDD voltage level. Next, the transfer gate TG is turned off (disconnecting the photodiode PD and floating diffusion FD) and the photodiode PD is left to integrate light.

After integration, the signal measurement occurs. First, the reset transistor RST is turned on and off to reset the floating diffusion FD. Immediately after this, the reset level is sampled from the floating diffusion FD and stored on the column circuit, i.e., bitline 20. Next, the transfer gate TG is turned on and off which allows charge on the photodiode PD to transfer to the floating diffusion (FD). Once the charge transfer is complete, this charge (the photodiode signal level plus the floating diffusion reset level) is measured and stored on bitline 20 as well.

These two stored voltages are then differenced ($D_{sig}-D_{rst}$) to determine the photodiode signal level. This design allows for correlated double sampling ("CDS") operation to occur, as the reset level used to determine the absolute pixel level is now measured before the signal level and the same reset level is referenced throughout the measurement. The 4T pixel design 10 significantly improves the performance of other CMOS image sensors, reducing both read noise and image lag. In addition, the design reduces pixel source follow offsets and the like.

However, one disadvantage with such 4T pixel designs using digital double sampling to suppress noise is that the output signals on the column circuit are doubled, effectively doubling bandwidth usage. Thus, a system and method for a CMOS image sensor is needed that reduces required output bandwidth while also suppressing kTC noise and suppressing full analog disturbances.

SUMMARY

Accordingly, as provided herein, method is disclosed for performing differential double sampling and a CMOS image sensor for performing the same. The disclosedCMOS image sensor includes a pixel array with a plurality of 4T four shared pixels. The method provides for a differential readout to have a reset of the storage node (i.e., the floating diffusion point) for each pixel and to read out the dark value. Next, a transfer from one subpixel of the pixel is applied to readout a dark plus bright value. During processing, these two samples will be subtracted to readout the first subpixel. Next, a transfer from a second subpixel is applied, and the charge is added to the storage node. This storage node now holds two bright samples, i.e., a double bright value from two subpixels of the pixel. The dark and initial bright values are subtracted from this double bright value, resulting in the video value from subpixel two of the pixel. Moreover, to readout a 4T shared pixel with reduced amount of driving circuitry, two floating diffusion points in two adjacent pixels are sampled and read in parallel.

According to the disclosure herein, the exemplary method and sensor provide for an efficient readout of pixel values from a pixel array that reduces the required output bandwidth and enables digital double sampling through the whole analog chain of the pixel array. Moreover, using the disclosed technique, effects like Black sun and fluctuating analog disturbances are avoided and suppressed.

The above simplified summary of example aspects serves to provide a basic understanding of the present disclosure. This summary is not an extensive overview of all contemplated aspects, and is intended to neither identify key or critical elements of all aspects nor delineate the scope of any or all aspects of the present disclosure. Its sole purpose is to present one or more aspects in a simplified form as a prelude to the more detailed description of the disclosure that follows. To the accomplishment of the foregoing, the one or more aspects of the present disclosure include the features described and exemplary pointed out in the claims.

BRIEF DESCRIPTION OF THE DRAWINGS

The accompanying drawings, which are incorporated into and constitute a part of this specification, illustrate one or more example aspects of the present disclosure and, together with the detailed description, serve to explain their principles and implementations.

DETAILED DESCRIPTION

Figure 1:
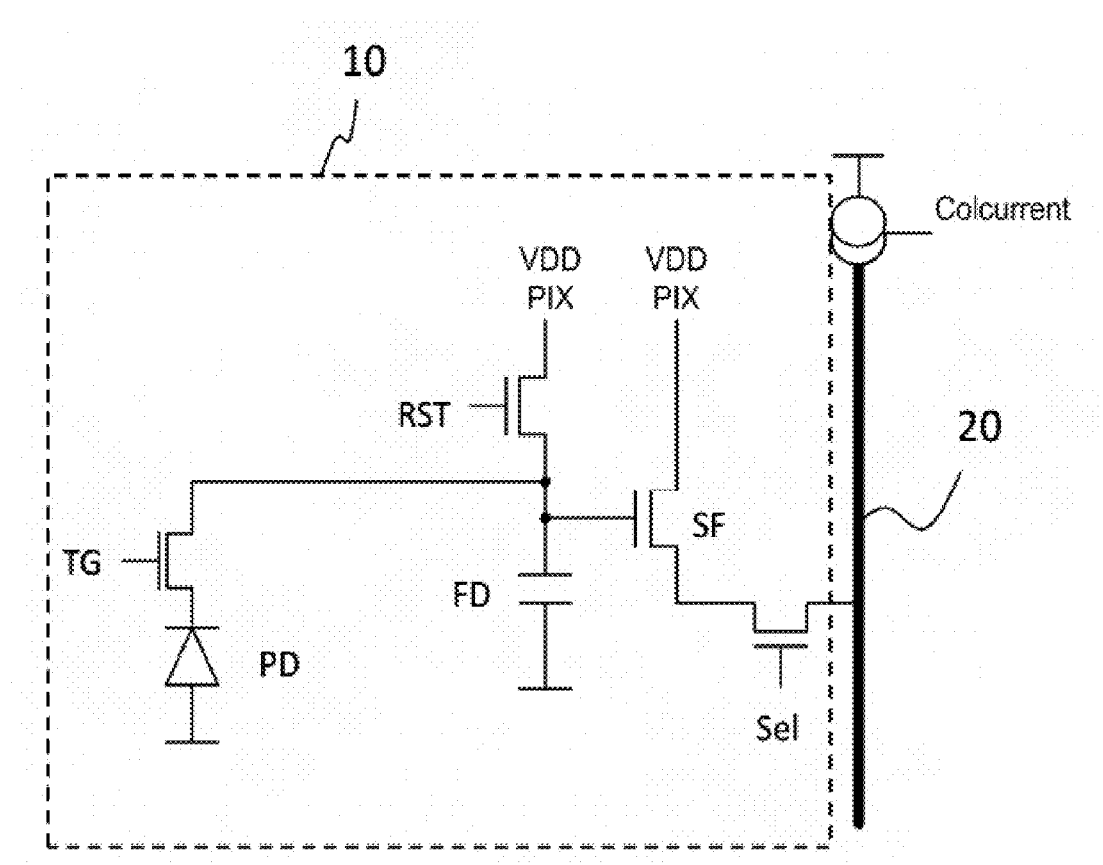
FIG. 1 illustrates a conventional design of a 4T pixel configuration of a CMOS image sensor connected to a column circuit.

Various aspects of the disclosed system and method are now described with reference to the drawings, wherein like reference numerals are used to refer to like elements throughout. In the following description, for purposes of explanation, numerous specific details are set forth in order to promote a thorough understanding of one or more aspects of the disclosure. It may be evident in some or all instances, however, that any aspects described below can be practiced without adopting the specific design details described below. In other instances, well-known structures and devices are shown in block diagram form in order to facilitate description of one or more aspects. The following presents a simplified summary of one or more aspects of the invention in order to provide a basic understanding thereof.

Figure 2:
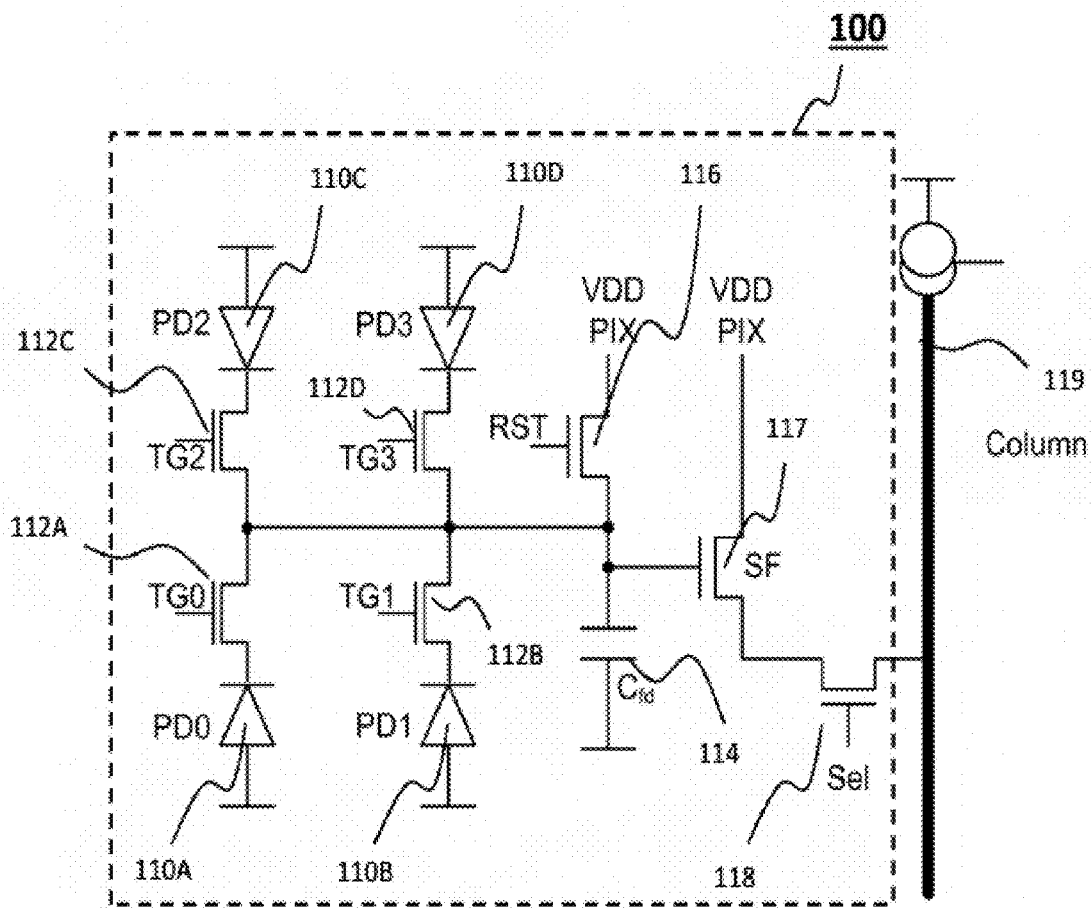
FIG. 2 illustrates a schematic diagram of an exemplary 4T shared pixel CMOS image that can be implemented in connection with an exemplary embodiment.

FIG. 2 illustrates a schematic diagram of an exemplary 4T shared pixel CMOS image sensor that can be implemented in connection with an exemplary embodiment. The pixel 100 includes a similar configuration as the 4T pixel described above except that it includes four sub-pixels, i.e., photodiodes 110A, 110B, 110C and 110D (also shown as PD0-PD3) that are each driven by a respective transfer gate (shown as TG0-TG3). The transfer gates, which are CMOS transistors, are identified by reference numerals 112A, 112B, 112C and 112D. As shown, each of the transfer gates 112A-112D shares a common readout circuit and is connected to floating diffusion point, 114, i.e., capacitor $C_{fd}$. As further shown, both transistor 116 (reset transistor) and transistor 117 have drains connected to the voltage source of the pixel (i.e., VDD PIX). The source of reset transistor 116 is connected to the floating diffusion point 114 and the source of transistor 117 is connected to the drain of the select transistor 118. The source of select transistor 118 is connected to the column circuit 119.

As will be discussed in more detail below, each sub-pixel (i.e., each of photodiodes PD0-PD3) can be read out separately by activating its corresponding transfer gate. Thus, to read out photodiode 110A, the transfer gate 112A is turned on/activated, then photodiode 110B is read out by activating transfer gate 112B, and so forth. In some instances, multiple sub-pixels will be read out at the same time as a single read operation by activating the respective transfer gates simultaneously. The specific operation and read out method will be described in detail below with respect to the timing diagram as an example. Moreover, it should be appreciated that the exemplary 4T 4 shared pixel shown in FIG. 2 provides one example of a pixel for a pixel array that can be implemented using the differential digital double sampling technique described herein. However, the inventive technique can also be implemented on other similar types of pixel designs and is not limited to the specific configuration shown in FIG. 2.

Figure 3:
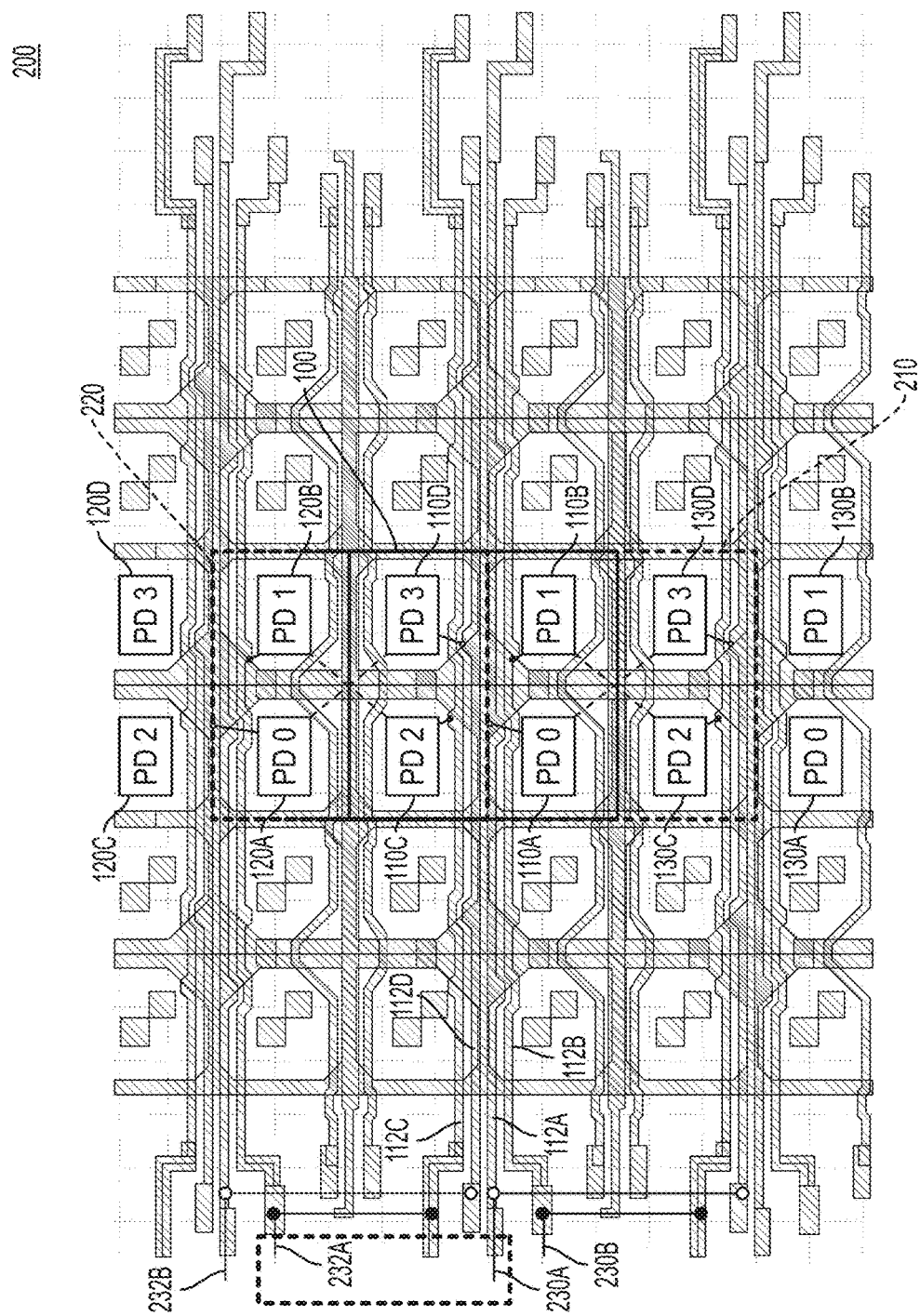
FIG. 3 illustrates a top-down view of a portion of a pixel cell array configured to perform differential digital double sampling according to an exemplary embodiment.

FIG. 3 illustrates a top-down view of a portion of a pixel cell array configured to perform differential digital double sampling according to an exemplary embodiment. The pixel array 200 includes a multitude of pixels described above. For example, as shown in the middle of the exemplary array 200, pixel 100 is shown as a solid dark square and includes sub-pixels (i.e., photodiodes PD0-PD3) identified as photodiodes 110A-110D. As further shown, a pixel including photodiodes 120A, 120B, 120C and 120D is shown in the array row above the row of pixel 100 and another pixel including photodiodes 130A, 130B, 130C and 130D is shown in the array row below the row of pixel 100.

According to the exemplary embodiment, there are six columns of subpixels in the array with pairs of columns each having a respective pair of subpixels that together form a pixel. Moreover, the array 200 preferably comprises vertical shift registers that are 1125 lines deep, i.e., 1125 rows in the array 200. Thus, in this embodiment, the platform for the array is limited to 1125 rows times six columns or 6750 lines at maximum speed. Moreover, as will be explained in detail below, the differential digital double sampling is performed with one dark level per two subpixels, which facilitates reduction of consumed bandwidth compared with existing pixel array readout techniques.

As further shown, each of the photodiodes of pixel 100 are connected to its respective transfer gate as described above. Thus, photodiode 110A is connected to transistor 112A, photodiode 110B is connected to transistor 112B, photodiode 110C is connected to transistor 112C, and photodiode 110D is connected to transistor 112D. Although pixel 100 is illustrated with a solid line square, the array 200 provides a cross connection of pixels such that sub-pixels of adjacent pixels are readout concurrently to minimize bandwidth. Each readout is illustrated with dashed lines and boxes. Thus, the sub-pixels forming the grouping of sub-pixels 210 is readout first followed by the grouping of sub-pixels 220, as will become readily apparent based on the following disclosure. It should be appreciated that the readout scheme shown in FIG. 3 is an exemplary embodiment, but that the differential digital double sampling technique described herein can be implemented in other configurations without the cross-connection design. For example, the inventive differential digital sampling technique could also be implemented in pixel configurations where the subpixels were addressed individually.

Thus, photodiode 110C (PD2) of pixel 100 is readout concurrently when photodiode 120B (PD1) of the pixel in the row above is readout. Similarly, photodiode 110D (PD3) of pixel 100 is readout concurrently when photodiode 120A (PD0) of the pixel in the row above is readout. Moreover, when photodiode 110A (PD0) of pixel 100 is readout, photodiode 130D (PD3) of the pixel in the row below is also readout. Similarly, when photodiode 110B (PD1) of pixel 100 is readout, photodiode 130C (PD3) of the pixel in the row below is also readout.

As explained above with reference to FIG. 2, to readout a value of a particular photodiode, the respective transfer gate must be activated. In this instance, transfer gate signals are applied to pixels in adjacent rows, but not being part of the pixel, to read out two values concurrently. For example, as shown a transfer gate signal $TG_{0/3}$ (i.e., signal 230A) is applied to transistor 112A, such that the pixel 110A can be read out as shown above. As further shown, this transfer gate signal 230A is also applied to the transfer gate for photodiode 130D on the adjacent row below the row of pixel 100. During the same clock cycle that the transfer gate signal 230A is activated, the control circuit also activates transfer gate signal 230B, which activates the transfer gates for photodiode 110B of pixel 100 and photodiode 130C (i.e., PD2) of the pixel directly below pixel 100. As shown, transfer gate signal 230A and transfer gate signal 230B are in the same row of the shift register.

Furthermore, during the next readout period, transfer gate signals 232A and 232B will be applied in a similar manner. Transfer gate signals 232A activates the transfer gates for photodiode 110C of pixel 100 and photodiode 120B of the pixel directly above pixel 100 in the array 200. Similarly, transfer gate signals 232B activates the transfer gates for photodiode 110B of pixel 100 and photodiode 120C of the pixel directly above pixel 100 in the array 200. The specific timing and operation of pixel readout will be described in detail below with respect to the timing diagram, the technical benefits of which will be readily apparent by the reduction of bandwidth requirements.

Figure 4:
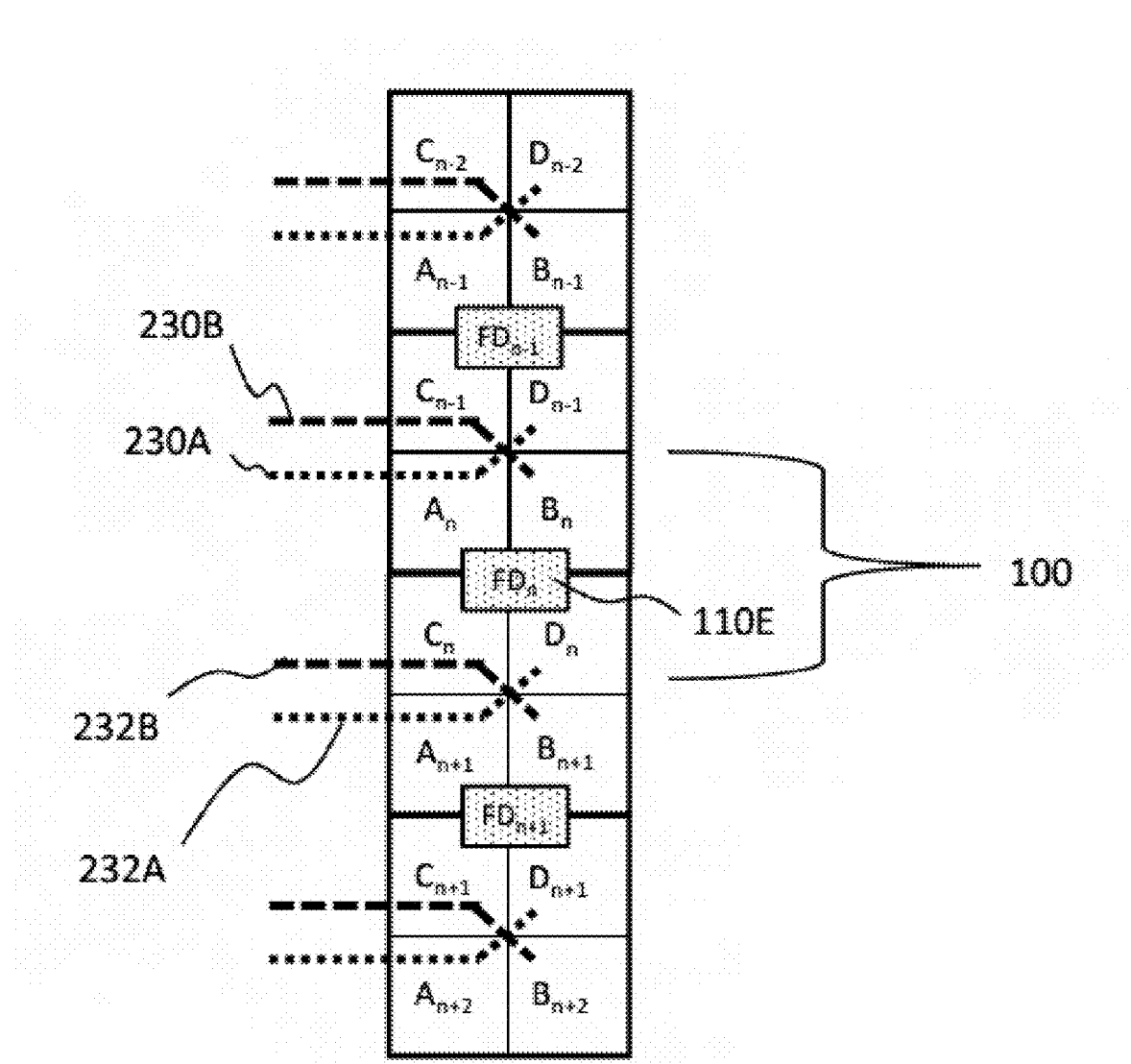
FIG. 4 illustrates a block diagram of a more detailed view a portion of a pixel cell array shown in FIG. 3.

FIG. 4 illustrates a block diagram of a more detailed view a portion of a pixel cell array shown in FIG. 3. In particular, the column shown includes pixel 100 referenced above that includes sub-pixels $A_n$, $B_n$, $C_n$ and $D_n$. These sub-pixels correspond to sub-pixels 110A-110D as discussed above. Moreover, as described above, each 4T shared pixel includes a floating diffusion point, which is illustrated as $FD_n$ and denoted by 110E in the figure. As further shown, a 4T pixel in the preceding row is formed by sub-pixels $A_{n-1}$, $B_{n-1}$, $C_{n-1}$ and $D_{n-1}$ (including floating diffusion point $FD_{n-1}$) and two sub-pixels $C_{n-2}$ and $D_{n-2}$ are formed above this pixel.

Similarly, the row following pixel includes a 4T pixel formed by sub-pixels $A_{n+1}$, $B_{n+1}$, $C_{n+1}$ and $D_{n-1}$ (including floating diffusion point $FD_{n+1}$) and two sub-pixels $A_{n+2}$ and $B_{n+2}$ are formed below this pixel. For purposes of this disclosure, the row for each pixel can be consider as rows n-2, n-1, n, n+1 and n+2.

As described above, each transfer gate is activated for two adjacent sub-pixels in the vertical direction (relative to the array) that are in different adjacent pixel rows (e.g., in n-1 and n rows or in n and n+1 rows). Thus, the transfer gates for sub-pixels $C_{n-1}$ and $B_n$ is first activated by transfer gate signal 230B. Since these sub-pixels $C_{n-1}$ and $B_n$ are in different rows, i.e., different pixels, the values can be readout during the same clock cycle. Next, a transfer gate signal 230A is applied to activate sub-pixels $A_n$ and $D_{n-1}$. As will be discussed in more detail below, the readout of the n pixel row (i.e., pixel 100) is the double bright value of $A_n$ and $B_n$. Since the value of $B_n$ was already determined in response to activation by transfer gate signal 230B, the pixel value of $A_n$ can be determined by subtracting the value of $B_n$ from double bright value of $A_n$ and $B_n$, as well as subtracting the dark value of the pixel). After the activation by the pair of transfer gate signals 230A and 230B, the CMOS image sensor has performed a readout of sub-pixels $A_n$, $B_n$, $C_{n-1}$ and $D_{n-1}$. It should be appreciated that this readout corresponds to the dashed box shown in FIG. 3 in which sub-pixel 110A (i.e., $A_n$), sub-pixel 110B (i.e., $B_n$), sub-pixel 130C (i.e., $C_{n-1}$), and sub-pixel 130D (i.e., $D_{n-1}$), are all readout during one clock cycle.

Referring back to FIG. 4, during the next cycle of readout, transfer gate signals 232B and 232A are applied to activate the corresponding pixels. In a similar manner as described above, the transfer gates for sub-pixels $C_n$ and $B_{n+1}$ is first activated by transfer gate signal 232B. Next, transfer gate signal 232A is applied to activate sub-pixels $A_{n+1}$ and $D_n$. The readout of the n pixel row (i.e., pixel 100) is the double bright value of $C_n$ and $D_n$. Since the value of $C_n$ was already determined in response to activation by transfer gate signal 232B, the pixel value of $C_n$ can be determined by subtracting the value of $D_n$ and the dark value of the pixel from the double bright value of $C_n$ plus $D_n$. Accordingly, after the activation by the pair of transfer gate signals 232A and 232B, the CMOS image sensor has performed a readout of sub-pixels $C_n$, $D_n$, $A_{n+1}$ and $B_{n+1}$.

Figure 5A:
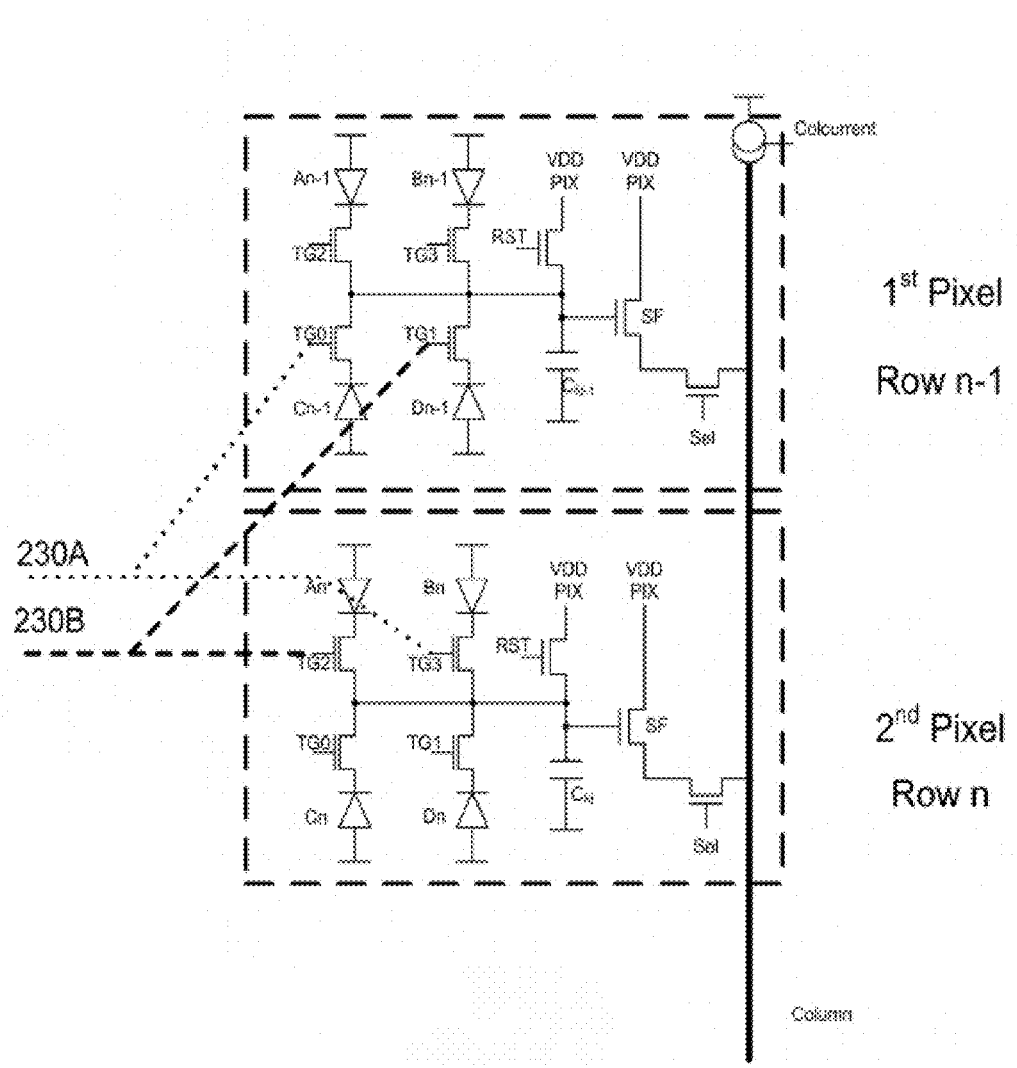
FIGS. 5A and 5B illustrate schematic diagrams of a plurality of 4T shared pixels in a pixel array for providing differential digital double sampling according to an exemplary embodiment.
Figure 5B:
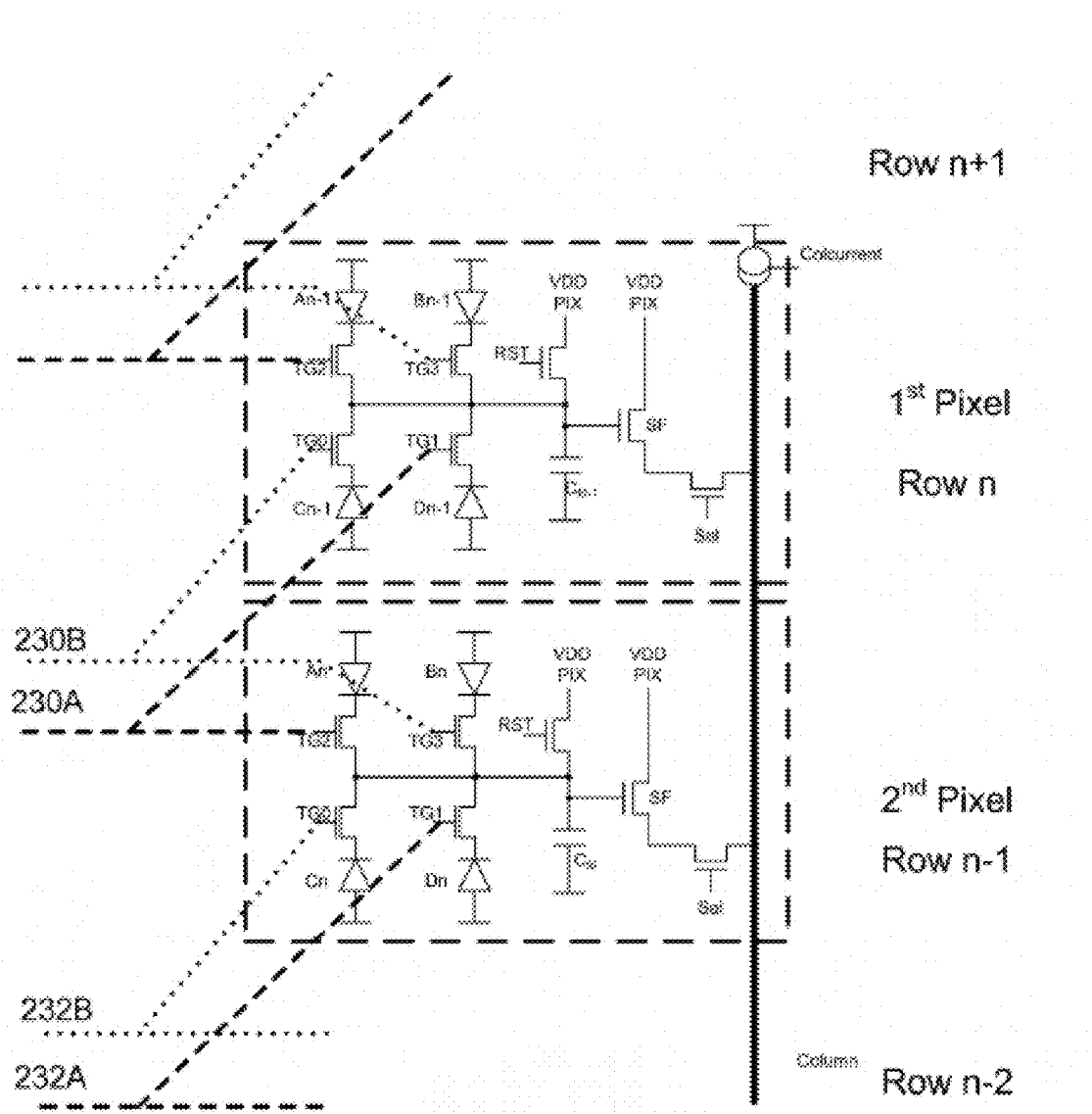

FIGS. 5A and 5B illustrate schematic diagrams of a plurality of 4T shared pixels in a pixel array for providing differential digital double sampling according to an exemplary embodiment. As shown in FIG. 5A, the array includes a pair of adjacent rows, i.e., 1st pixel row n-1 and 2nd pixel row n, in the vertical direction of the array. It should be appreciated that each separate pixel in row n and n-1 includes the same 4T shared transistor circuit configuration discussed above with respect to FIG. 2 and will not be repeated herein. As shown, one transfer gates signal 230A is applied to the transfer gate (TG0) of sub-pixel $C_{n-1}$ and to the transfer gate (TG3) of sub-pixel $B_n$. Similarly, another transfer gates signal 230B is applied to the transfer gate (TG2) of sub-pixel $A_n$ and to the transfer gate (TG1) of sub-pixel $D_{n-1}$.

FIG. 5B illustrates the same pixel array circuit diagram and also shows application of additional transfer gates signal 232A and 232B, which are the same transfer gate signals described above. In both figures, the output of each pixel is connected to the column circuit to provide readouts as will be described in greater detail below. The timing of the readout of the pixel array is described as follows.

Figure 6A:
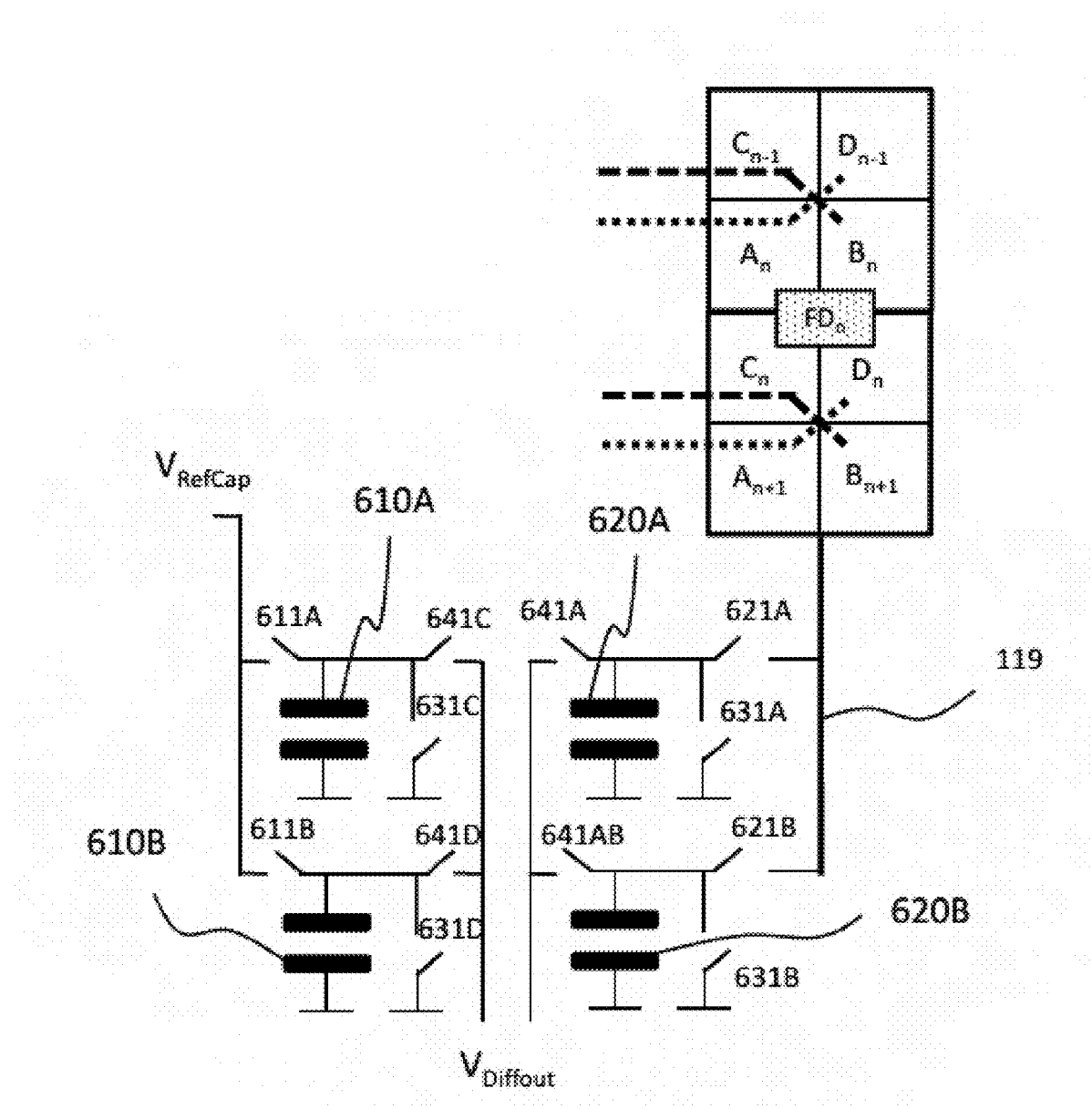
FIG. 6A illustrates a readout circuit of a CMOS image sensor for providing differential digital double sampling according to an exemplary embodiment.

FIG. 6A illustrates a readout circuit of a CMOS image sensor for providing differential digital double sampling according to an exemplary embodiment. As shown, the circuit includes four capacitors 610A, 610B, 620A and 620B that are provided to store the video level and the dark level for the digital double sampling. In particular, two "bright" capacitors (i.e., capacitors 620A and 620B) are provided to sample the video level and two "dark" capacitors (i.e., capacitors 610A and 610B) are provided to sample the reference level. Thus, as shown, capacitors 610A and 610B are coupled to a capacitor reference voltage to readout a fixed value from the reference voltage while capacitors 620A and 620B are coupled to the bitline (i.e., a column readout) of the pixel array to sample the pixel voltages of the dark, bright and double bright values of each pixel output (i.e., the video level). The readout path is fully differential and the connection of each capacitor depends on the mode of operation as will be described in detail below.

At the end of column line 119, there are two switches, 621A and 621B for selectively connecting the output of the pixel array to storage capacitors 620A and 620B to sample the dark, bright and double bright values, respectively, from the pixel array. Moreover, the readout circuit includes are two more switches, 611A and 611B for selectively connecting the storage capacitors 610A and 610B to a reference voltage for the capacitors.

Each of the capacitors 620A, 620B, 610A and 610B is respectively connected in parallel to a reset switch 631A, 631B, 631C and 631D, in order to reset the capacitors to a previous value to GND. As will be discussed below, a reset signal RST_CCAP is periodically applied at every count in the counter cycle during pixel sampling and readout. Moreover, column selection switches 641A-641D are respectively provided between the storage capacitors and a bus bar (not shown) that ultimately outputs the measured differential voltages to an A/D converter (also not shown) and then to a buffer. Thus, the column selection switches 641A-641D are controlled to output stored signals from storage capacitors 610A, 610B, 620A and 620B to one of the columns at a time to the bus bar. Each of the pixels is activated at a given time by a row decoder.

Advantageously, using this design, the sampling of the pixel output voltage from the pixel array is decoupled from the A/D conversion. The decoupling enables high speed readout of the pixel output voltages by putting these two actions in parallel instead of serial operation.

Figure 6B:
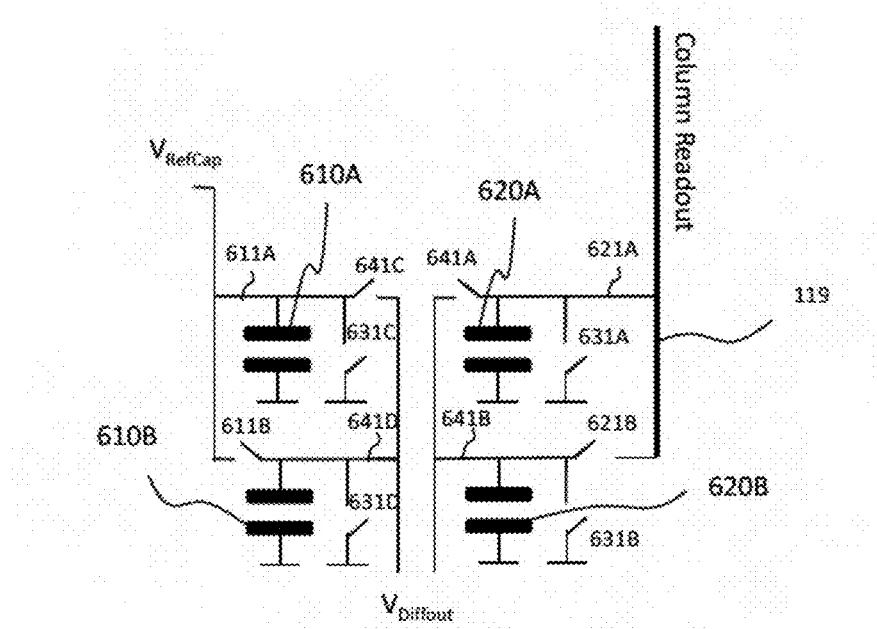
FIG. 6B and 6C illustrates operational states of the readout circuit shown in FIG. 6A according to an exemplary embodiment.
Figure 6C:
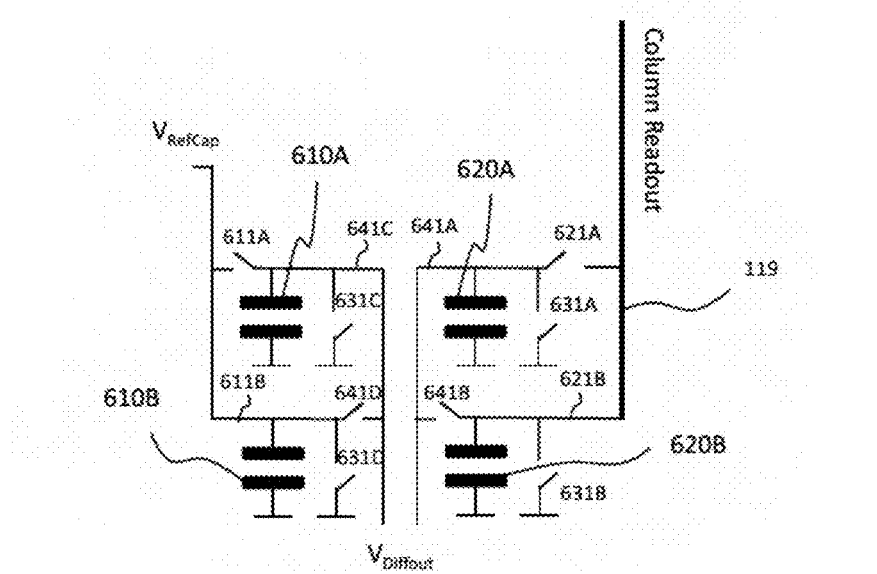

FIG. 6B and 6C illustrates operational states of the readout circuit shown in FIG. 6A according to an exemplary embodiment. As shown, the switches 621A and 641A as well as switches and 621B and 641B alternatively toggle between open and closed states such that while capacitor 620A is obtaining a readout value from the pixel array (e.g., FIG. 6B), the value in capacitor 620B is being readout. Similar operation is also performed for witches 611A and 641C as well as 611B and 641D for the reference voltage. The details of circuit and these operations are explained as follows.

Figure 6D:
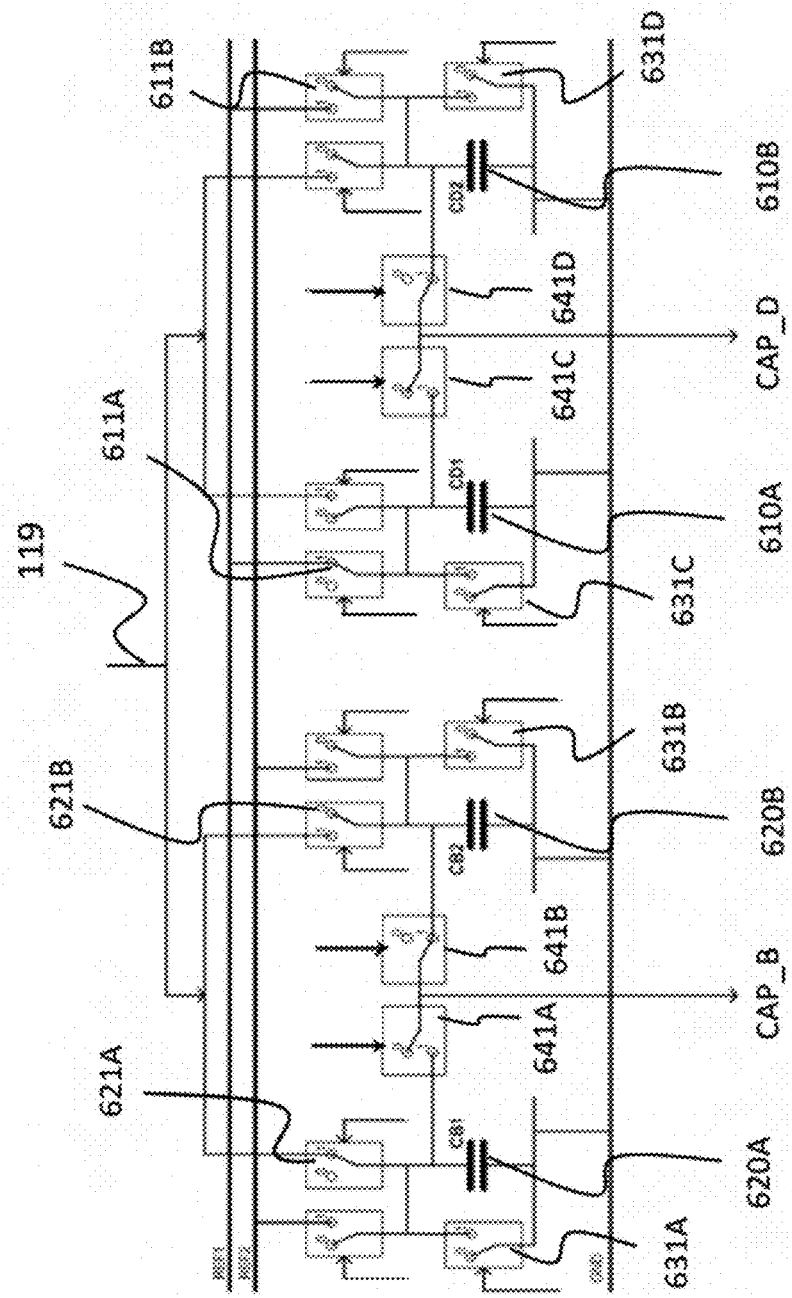
FIG. 6D illustrates a schematic diagram of the readout circuit shown in FIG. 6A according to an exemplary embodiment.

In particular, FIG. 6D illustrates a schematic diagram of the readout circuit shown in FIG. 6A according to an exemplary embodiment. In general, the column readout circuit is formed from four column capacitors, i.e., capacitors 610A, 610B, 620A and 620B, selectively coupled to the pixel array by a plurality of switches. As noted above, storage capacitors 620A and 620B are provided to sample the dark, bright and double bright values, respectively, from the pixel array. Moreover, the storage capacitors 610A and 610B are provided to sample a reference voltage for the capacitors.

According to the exemplary embodiment, the capacitors are configured to decouple the horizontal readout from the pixel array by receiving the sampled values on bitline 119. In this aspect, for each count, two capacitors are sampled and two capacitors are readout in an alternating manner. Thus, each of the switches is driven based on corresponding reset and control signals. As noted above, each of the capacitors is connected in parallel to a reset switches 631A, 631B, 631C and 631D, respectively. During each count of operation a short pulse (e.g., 49 nanoseconds) is activated to reset the capacitors by closing the switch to force the ground connection.

Furthermore, capacitors 620A and 620B are coupled to the bitline 119 by switches 621A and 621B. In the example of FIG. 6D, capacitor 620A is connected to the bitline 119 since switch 621A is closed. Thus, capacitor 620A is in a sampling mode, i.e., it is sampling one of the dark, bright and double bright values being output from the pixel array. Alternatively, capacitor 620B is not currently connected to bitline 119 since switch 621B is open. In the next count, a control signal will close switch 621B and open switch 621A to reverse the operations. As further shown, column connection switches 641A and 641B connect capacitors 620A and 620B to the downstream circuit, including the A/D converter (not shown). In this example, switch 641B is closed to connect capacitor 620B to the bus bar downstream, and, therefore, being readout by the circuitry. Column connection switches 641A and 641B are reversed in the next count so that capacitor 620A can be read out.

The switches connected to capacitors 610A and 610B operate in a similar manner as those switches discussed above. As shown, capacitors 610A and 610B are coupled to the capacitor reference voltage (i.e., REF1) by switches 611A and 611B. In the example shown, capacitor 610A is connected to the reference voltage since switch 611A is closed. Thus, capacitor 610A is in a sampling mode, i.e., it is sampling the reference voltage. Alternatively, capacitor 610B is not currently connected to reference voltage since switch 611B is open. In the next count, a control signal will close switch 611B and open switch 611A to reverse the operations. As further shown, column connection switches 641C and 641D connect capacitors 610A and 610B to the downstream circuit, including the A/D converter (not shown). In this example, switch 641D is closed connecting capacitor 610B to the bus bar downstream, and, therefore, being readout by the circuitry. These switches are reversed in the next count so that capacitor 610A can be read out.

In operation, the capacitors CB1 and CB2 (i.e., capacitors 620A and 620B) alternatively sample values from pixel array (via bitline 119) and readout values downstream to the A/D converter. Likewise, the capacitors CD1 and CD2 (i.e., capacitors 610A and 610B) alternatively sample values from the reference voltage and readout values downstream to the A/D converter. Thus, a voltage difference between the sampled pixel values and the sampled reference value is continuously output from the column readout circuit to provide a value of each sub-pixel, including both the non-energized state and energized state for the digital double sampling processing. The operation of the CMOS image sensor is explained in more detail in the timing diagram described as follows.

Figure 7A:
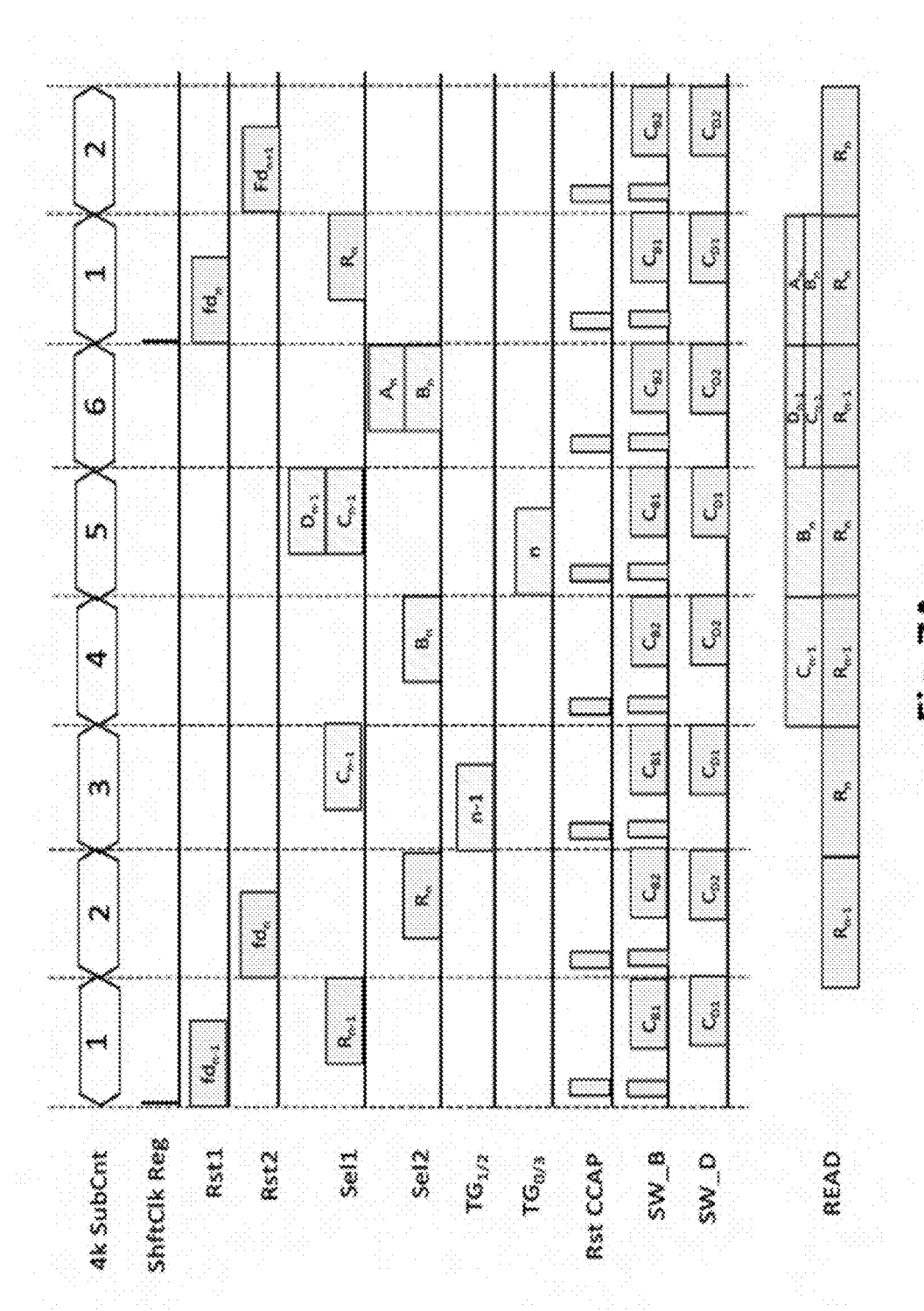
FIGS. 7A and 7B illustrate timing diagrams of a pixel array of a CMOS image sensor for providing differential digital double sampling according to an exemplary embodiment.

Specifically, FIG. 7A illustrates a timing diagram of a pixel array of a CMOS image sensor for providing differential digital double sampling according to an exemplary embodiment. As shown, the horizontal readout scheme is based on the counter, i.e., the 4k SubCnt, which provides a six count to perform each readout. In this regard, the counter performs the count operation in synchronization with clocks having a fixed period. In one embodiment, the readout is performed in accordance with the 1080p standard with each readout (i.e., each clock cycle) being performed at 14.86 µs. In general, after each readout cycle, there are six values that are obtained, two dark values, two bright values, and two double bright values. After the differential digital double sampling technique is applied using these values, corrected digital outputs of four pixels can be obtained, which generates a 4k/UHD standard.

For purposes of illustration, the timing diagram is annotated in accordance with the sub-pixels shown in FIG. 4 and discussed above. As shown, at a first count value, a reset signal Rst1 is applied to row n−1, and more particularly, to reset floating diffusion point $fd_{n-1}$. Preferably, the reset signals have a width of 22 clks at 222 MHz or 99 nanoseconds. During this same count, a select signal Sel1 is applied to row n−1, i.e., $R_{n-1}$. Preferably, the select signals have a width of 210 clks at 222 MHz or 943 nanoseconds. Similarly, at a second count value, a reset signal Rst2 is applied to row n, i.e., to floating diffusion point $fd_n$, and a select signal Sel2 is applied to row n, i.e., to $R_n$. Thus, it should be appreciated that in accordance with the DDS filtering technique, each of rows n−1 and n have been reset such that the digital data $D_{rst}$ (i.e., dark values) for each pixel can be obtained. This is shown in the readout row (i.e., "READ") in which the dark values $R_{n-1}$ and $R_n$ are read out from the pixel array during counts 2 and 3 of the clock cycle.

In general, the timing diagram illustrates that the capacitors are reset by RST_CCAP value at the top of each count and the control signal SW_B for capacitors 620A and 620B and the control signal SW_D for capacitors 610A and 610B are continuously applied (i.e., the switches a repeatedly toggled from an open state to a closed state as described above) to sample the date on the bitline as should be understood to those skilled in the art. The resetting and sampling of these capacitors will not be described for each separate count in the cycle.

Once the dark values $R_{n-1}$ and $R_n$ are sampled at counts 1 and 2 and readout at counts 2 and 3, the timing continues to count 3 of the cycle. As shown, a transfer gate $TG_{1/2}$ is applied to activate the corresponding sub-pixel in rows n−1 and n. For example, this transfer gate signal $TG_{1/2}$ corresponds to signal 230B described above and activates sub-pixels $C_{n-1}$ and $B_n$. Thus, when select signal Sel1 is applied again to row n−1, sub-pixel $C_{n-1}$ can be readout as further shown during count 4. Similarly, when select signal Sel2 is applied again to row n, sub-pixel $B_n$ can be readout as further shown during count 5. Preferably, the transfer gate signals have a width of 320 clks at 222 MHz or 1437 nanoseconds. It is noted that the bright value read out (e.g., sub-pixel $C_{n-1}$) will also include the correspond dark value (e.g., dark value $R_{n-1}$). Thus, as further described herein, the bright value is calculated by subtracting the measured dark value $R_{n-1}$ from the measured bright value $C_{n-1}$, and so forth.

Furthermore, during count 5, a transfer gate $TG_{0/3}$ is applied to activate the corresponding sub-pixels in row n and n−1. This transfer gate signal $TG_{0/3}$ corresponds to signal 230A described above and activates sub-pixels $D_{n-1}$ and $A_n$. Thus, when select signal Sel1 is applied again to row n−1, a double bright value of both sub-pixel $C_{n-1}$ and $D_{n-1}$ can be readout as further shown during count 6. Similarly, when select signal Sel2 is applied again to row n, a double bright value of sub-pixel $B_n$ and sub-pixel $A_n$ can be readout as further shown during count 1 of the next clock cycle. Accordingly, during this counter cycle, the readout circuit has sampled values from sub-pixels $C_{n-1}$ and $B_n$ and double bright values from sub-pixels $C_{n-1}$ and $D_{n-1}$ and from sub-pixels $A_n$ and $B_n$ as well as the corresponding dark values $R_{n-1}$ and $R_n$. As will be described below, the values for sub-pixels $D_{n-1}$ can be determined by removing the value of $C_{n-1}$ from the double bright value and the dark value $R_{n-1}$ and so forth. Similarly, the values for sub-pixels $A_n$ can be determined by removing the value of $B_n$ from the double bright value as well as the dark value $R_n$.

Figure 7B:
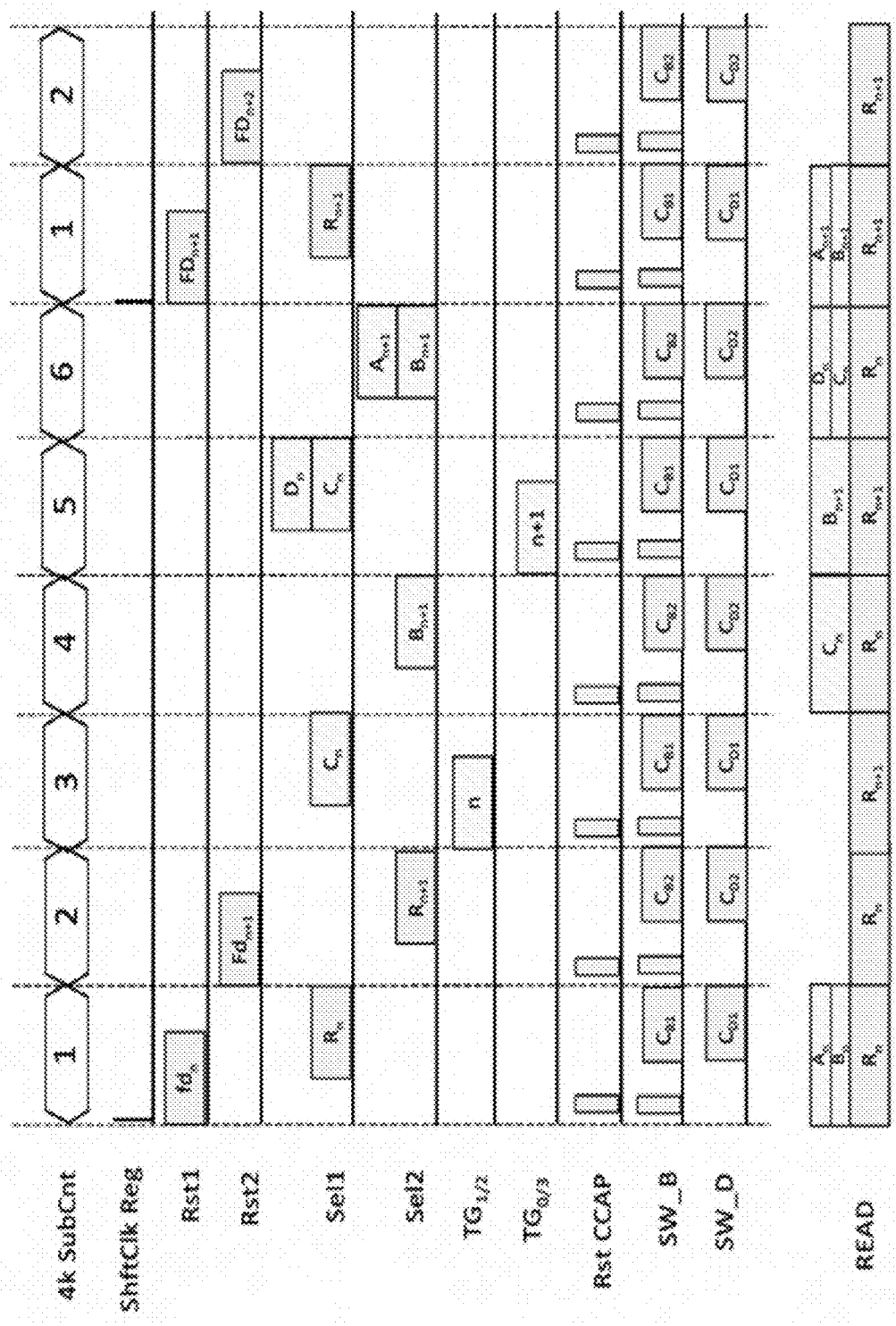

After the six count of the clock cycle, the shift register clock shifts to the next row in the pixel array. FIG. 7B illustrates a timing diagram of the control signals in the next row in the array. The same operations are performed as that described above for the timing diagram of FIG. 7A and will not be repeated herein.

Figure 8:
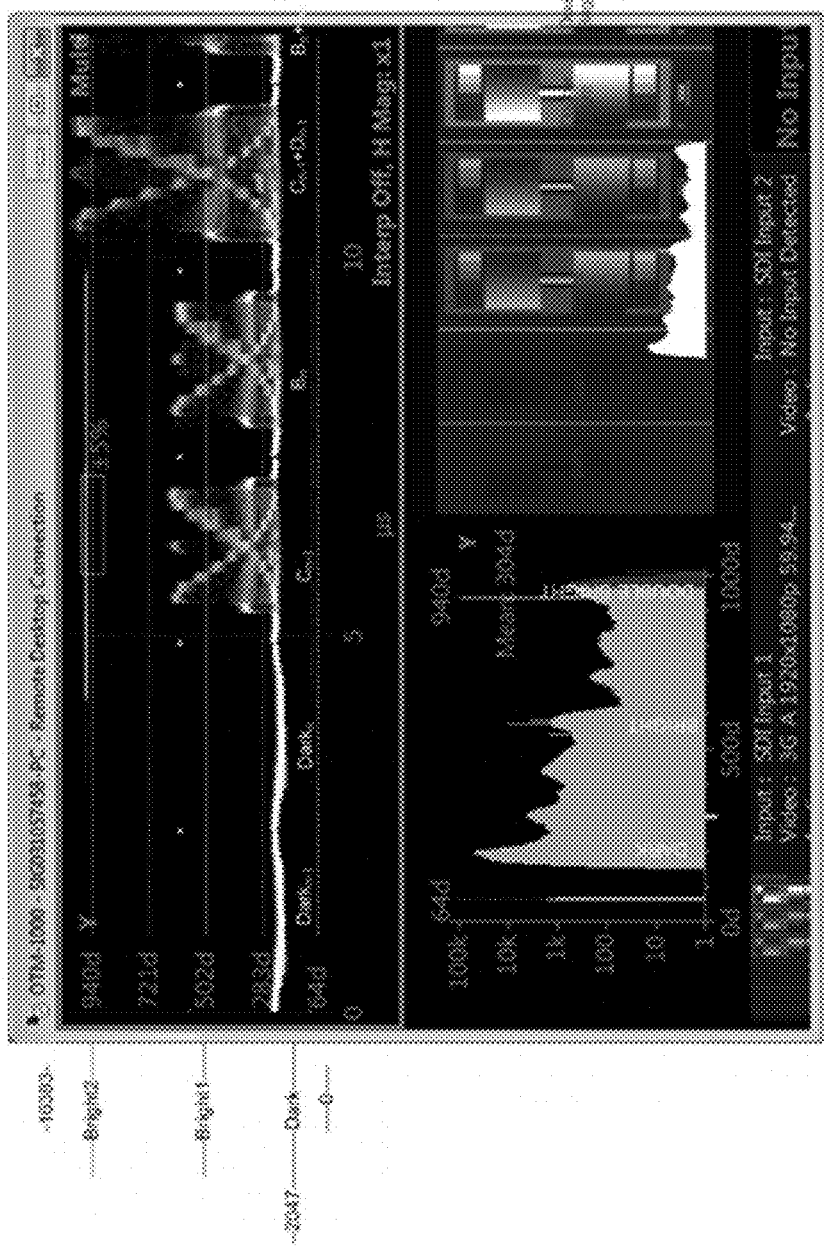
FIG. 8 illustrates a simulation of measured pixel output values of a pixel array of a CMOS image sensor for providing differential digital double sampling according to an exemplary embodiment.

FIG. 8 illustrates a simulation of measured pixel output values of a pixel array of a CMOS image sensor for providing differential digital double sampling according to an exemplary embodiment. As shown, the initial dark values (i.e., $Dark_{n-1}$ or $D_{n-1}$ and $Dark_n$ or $D_n$) are measured at a first value of slightly below 283d. Next, measured values of sub-pixels $C_{n-1}$ or $B_n$ are measured at approximately 680d. Furthermore, a double-bright value for $C_{n-1}$ and $D_{n-1}$ is measured at slightly over the 940d value. Thus, applying the digital double sampling method described herein, the values of sub-pixels $C_{n-1}$ and $B_n$ can be calculated by subtracting the dark values $Dark_{n-1}$ (i.e., $D_{n-1}$) and $Dark_n$ (i.e., $D_n$), respectively. Moreover, the value of sub-pixel $D_{n-1}$ can be determined by subtracting form the measured value the value of sub-pixel $C_{n-1}$ and dark value $Dark_{n-1}$ (i.e., $D_{n-1}$). It should be appreciated that this simulation is based on the current cross-connection pixel readout scheme described above and shown in the figures, such as FIG. 4, for example. In alternative embodiments, if the cross-connection was not used for the technique, the order of pixel readout could be, for example, dark, bright, double bright, dark, bright, double bright (instead of dark, dark, bright, bright, double bright, double bright).

Figure 9:
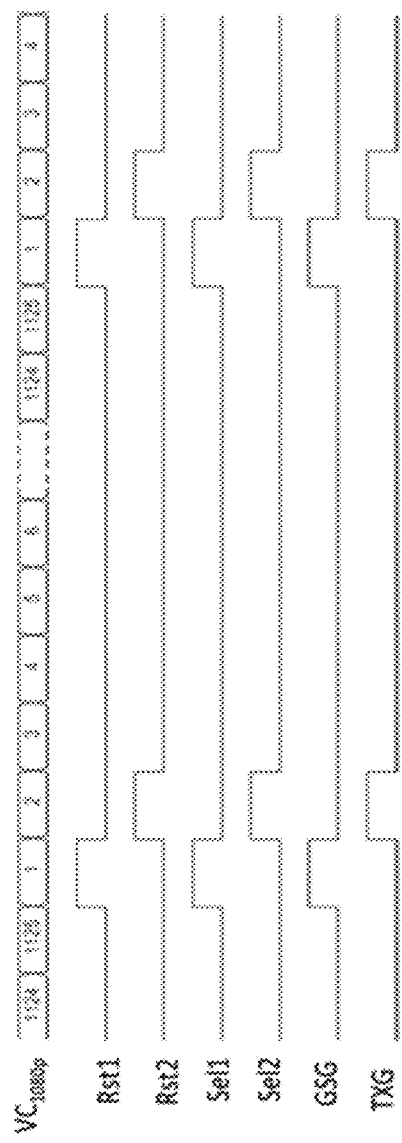
FIG. 9 illustrates a timing diagram of a vertical readout scheme for a pixel array of a CMOS image sensor for providing differential digital double sampling according to an exemplary embodiment.

FIG. 9 illustrates a timing diagram of a vertical readout scheme for a pixel array of a CMOS image sensor for providing differential digital double sampling according to an exemplary embodiment. As noted above, the pixel array described herein (i.e., pixel array 200 shown in FIG. 3) preferably comprises vertical shift registers that are 1125 lines deep, i.e., 1125 rows in the array 200. Thus, the client $VC_{1080p}$ is shown as having counts 1 through 1125. Each of reset signals RST1 and RST, select signals SEL1 and SEL 2, and transfer gate activation signals $TG_{0/3}$ and $TG_{1/2}$ are shown as cycling through in rows in response to control signals received from a row decoder as would be understood to one skilled in the art. It should be appreciated that there are corresponding reset, select and transfer gate activation signals for each row in the pixel array 200. Thus, the rows are cycled through to be sampled as described using the timing operation described herein.

Figure 10:
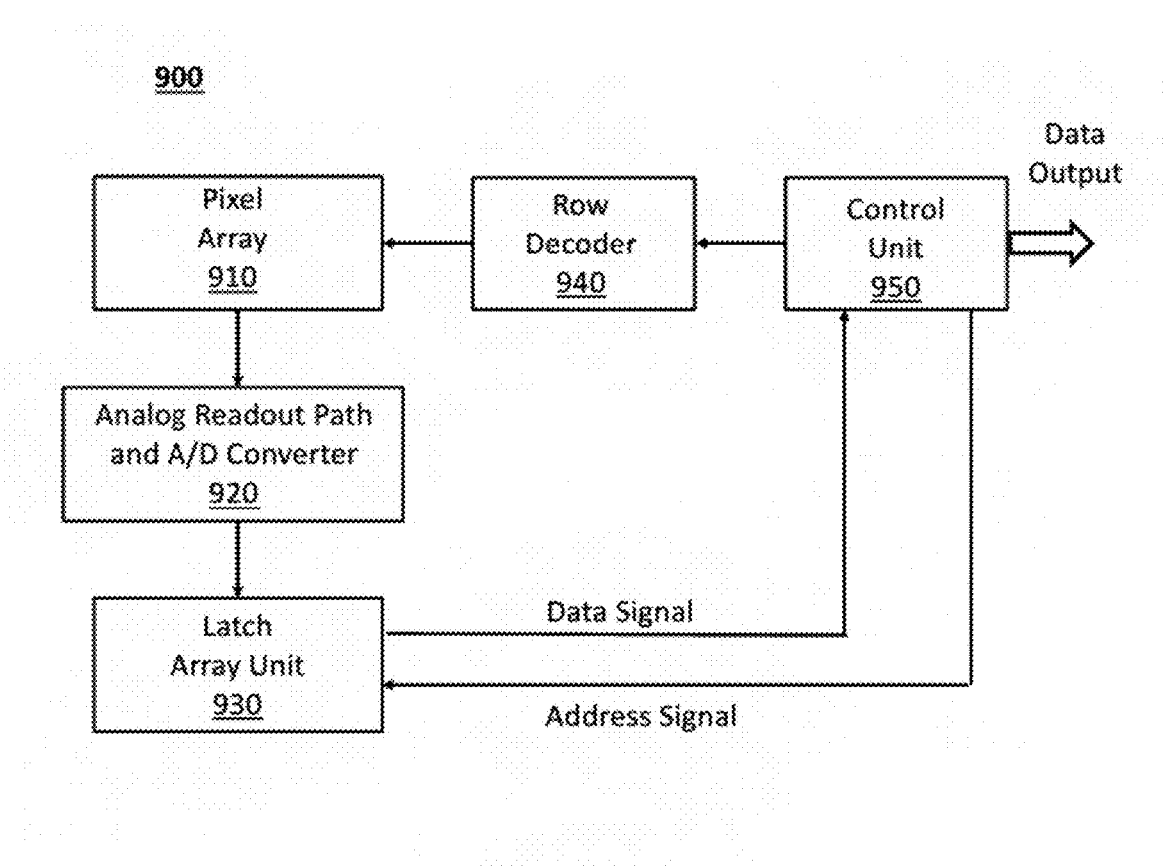
FIG. 10 illustrates a block diagram of a CMOS image sensor for providing differential digital double sampling according to an exemplary embodiment.

Finally, FIG. 10 illustrates a block diagram of a CMOS image sensor for providing differential digital double sampling according to an exemplary embodiment. As shown, the CMOS image sensor 900 includes a pixel array 910, which can be, for example, pixel array 200 described herein that includes a multitude of 4T share pixel configurations. Furthermore, the output of the pixel array 910 is fed to an analog readout path and A/D converter 920, which is provided for processing the analog output voltages from the pixel array 910 to convert analog pixel signals into digital signals. It should be understood that the analog readout path and A/D converter 920 includes the readout circuit shown in FIGS.

6A-6D and A/D converters for converting the measured analog signals to digital signals as is known to those skilled in the art.

As further shown, a latch array unit (or line buffer) 930 is provided for storing the digital signals outputted from the analog readout path and A/D converter 920. It should be appreciated that the line buffer 930 can include multiple lines depending on the readout order of the pixels of pixel array 910. Moreover, a control unit 950 is provided for providing control signals used in controlling the aforementioned units and outputting data to the outside (e.g., a display unit) through an interface. For example, the control unit 950 in conjunction with row decoder 940 (collectively, a pixel sampler) can generate the activating signals described above with respect to FIGS. 7A and 7B. Moreover, in one embodiment, the control unit 950 can also generate the control signals to open and close the switches of the capacitor readout.

In addition, the data signals can be fed from the latch array unit 830 to the control unit 950. According to an exemplary embodiment, the bright values of each photodiode can be calculated by the control unit 950, i.e., a pixel output calculator, by subtracting the respective dark value for that pixel from the sampled bright value. For example, the sampled bright value $B_n$ as shown in FIG. 7A can be calculated by subtracting the dark value $R_n$ from the combined output value of $B_n$ plus $R_n$. Similarly, the bright value An can be calculated by subtracting the dark value $R_n$ and the sampled bright value $B_n$ from the combined output value of bright values $A_n$ and $B_n$ plus the dark value $R_n$. These calculations can be performed in software, hardware or a combination thereof as would be appreciated to one skilled in the art.

The control unit 950 can includes one or more processors and one or more modules for executed the control algorithms described herein. The modules may be software modules running in the processor, or resident/stored in memory, one or more hardware modules coupled to the processor, or some combination thereof. Examples of processors include microprocessors, microcontrollers, digital signal processors (DSPs), field programmable gate arrays (FPGAs), programmable logic devices (PLDs), state machines, gated logic, discrete hardware circuits, and other suitable hardware configured to perform the various functionality described throughout this disclosure. One or more processors in the processing system may execute software. Software shall be construed broadly to mean instructions, instruction sets, code, code segments, program code, programs, subprograms, software modules, applications, software applications, software packages, routines, subroutines, objects, executables, threads of execution, procedures, functions, etc., whether referred to as software, firmware, middleware, microcode, hardware description language, or otherwise.

Furthermore, the control unit 950 is coupled to a row decoder 940, which can be considered a pixel sampler of the pixel array, for example, that is configured to output the signals for selecting the rows in the pixel array 910 based on a control signal transmitted from the control unit 950.

Preferably the analog readout path and A/D converter 920 includes comparators as many as the number of columns of the pixel array 910 as described above. Each of the comparators serves a role of converting an analog pixel value of a column in which it is located into a digital signal. The digital signal is stored in the latch array unit 930 including latches as many as the number of the columns of the pixel array 910. The digital signals stored in the latch array unit 930 are subjected to an image processing by the control unit 950 and then, sequentially outputted through output pins of the image sensor in the image processed order. Thus, the control unit 950 is configured to output data to generate image data to be displayed on a screen of an electronic device as would be appreciated to one skilled in the art.

According to the disclosure herein, the exemplary method and sensor provide for an efficient readout of pixel values from a pixel array that reduces the required output bandwidth and enables digital double sampling through the whole analog chain of the pixel array. Moreover, using the disclosed technique, effects like Black sun and fluctuating analog disturbances are avoided and suppressed.

Advantageously, during sampling of the dark values, when the imager sensor receives no light during the first sample, the dark value holds the kTC, and the second and third samples also contain kTC, since no photo charge is added. Thus, all pixels hold readnoise only, and the kTC is suppressed.

Moreover, the CMOS image sensor and method described herein avoids the need for optical Black lines with a digital clamp. In general, optical black is very difficult to make since the broadcast lightning is very bright and cannot be shielded 100%. This technical limitation results in visible artifacts. The disclosed CMOS image sensor and method prevents and/or limits such artifacts. A clamp always generates some low frequency noise, which is very disturbing. Moreover, the residue error in a lineclamp results in vertical lines in the image. Thus, the CMOS image sensor avoids the need for optical Black lines with a digital clamp.

It should be appreciated that in the examples above, all switching signals are assumed to be positive logic signals, i.e. a high level, or "1" results in closing the switch. It is, however, also possible to use an inverted logic, or to use both, positive and negative, logic in a mixed manner. Moreover, the disclosed CMOS image sensor and method reduces the noise created in the digital double sampling stage, as described above, provides an increased speed of the overall readout circuit. In one aspect, the increase in the speed of the readout circuit allows for an increase in the number of pixels in a matrix, which is a key feature for high definition imaging.

While aspects have been described in conjunction with the example implementations outlined above, various alternatives, modifications, variations, improvements, and/or substantial equivalents, whether known or that are or may be presently unforeseen, may become apparent to those having at least ordinary skill in the art. Accordingly, the example implementations of the invention, as set forth above, are intended to be illustrative, not limiting. Various changes may be made without departing from the spirit and scope of the aspects. Therefore, the aspects are intended to embrace all known or later-developed alternatives, modifications, variations, improvements, and/or substantial equivalents.

Thus, the claims are not intended to be limited to the aspects shown herein, but is to be accorded the full scope consistent with the language claims, wherein reference to an element in the singular is not intended to mean "one and only one" unless specifically so stated, but rather "one or more." Unless specifically stated otherwise, the term "some" refers to one or more. All structural and functional equivalents to the elements of the various aspects described throughout this disclosure that are known or later come to be known to those of ordinary skill in the art are expressly incorporated herein by reference and are intended to be encompassed by the claims.

Moreover, nothing disclosed herein is intended to be dedicated to the public regardless of whether such disclosure is explicitly recited in the claims. No claim element is to be construed as a means plus function unless the element is expressly recited using the phrase "means for."

What is claimed:

1. An CMOS image sensing device for performing digital double sampling with parallel readout of adjacent pixels to minimize required output bandwidth during pixel sampling, the CMOS image sensing device comprising:
   a pixel array having a plurality of pixels with each pixel having a plurality of photodiodes, a floating diffusion point and a plurality of transistors electrically coupled to the plurality of photodiodes;
   a column readout circuit having a plurality of storage capacitors selectively coupled to the pixel array by a plurality of switches, the plurality of storage capacitors configured to store sampled pixel values stored by the floating diffusion point;
   a pixel sampler configured to selectively activate the plurality of transistors in at least a pair of adjacent pixels in the pixel array, such that each of the adjacent pixels outputs to the column readout circuit a sampled dark value of the pixel, a sampled bright value of a first photodiode of the plurality of photodiodes in the pixel, and a sampled double bright value of the first photodiode and a second photodiode of the plurality of photodiodes in the pixel; and
   a pixel output calculator configured to calculate an outputted bright value of each of the first photodiodes of each of the adjacent pixels by subtracting the sampled dark value from the sampled bright value of the first photodiode, respectively, and to calculate an outputted bright value of each of the second photodiodes of the adjacent pixels by subtracting the sampled dark value of the pixel and the sampled bright values of the respective first photodiode from the sampled double bright value of the first and second photodiodes of the respective pixel.

2. The CMOS image sensing device according to claim 1, further comprising a column readout circuit controller configured to transmit control signals to the plurality of switches in the column readout circuit such that at least a pair of the plurality of storage capacitors alternately store and output the sampled bright value and the sampled double bright value.

3. The CMOS image sensing device according to claim 2, wherein the column readout circuit includes at least another pair of capacitors configured to sample a reference voltage.

4. The CMOS image sensing device according to claim 3, wherein the column readout circuit controller is further configured to control the plurality of switches of the column readout circuit to output voltage differentials between the sampled reference voltage and each of the sampled bright value and the sampled double bright value, respectively.

5. The CMOS image sensing device according to claim 1, wherein the pixel array comprises a plurality of pixels in a column configuration, with each pixel comprising four photodiodes.

6. The CMOS image sensing device according to claim 5, wherein the pixel sampler is further configured to activate the plurality of transistors in adjacent pairs of the pixels, such that two photodiodes of two adjacent pixels of the plurality of pixels are sampled during each clock cycle.

7. The CMOS image sensing device according to claim 1, further comprising a plurality of analog-to-digital converters coupled to the column readout circuit and configured to generate respective digital signals configured to generate a corresponding image to be displayed on an electronic display device.

8. An image sensor with parallel readout of adjacent pixels to minimize output bandwidth required during pixel sampling, the image sensor comprising:
   a photodiode sampler configured to control a pair of pixels in a pixel array to output, in parallel, respective bright values of sampled first photodiodes in each of the pair of pixels and subsequently output, in parallel to and without resetting the pair of pixels, respective double bright values combining the sampled first photodiodes with sampled second photodiodes in the respective pixel;
   a readout circuit having a plurality of storage capacitors selectively coupled to the pixel array by a plurality of switches, wherein the plurality of storage capacitors are configured to store the outputted bright values and the outputted double bright values, respectively; and
   a pixel output calculator coupled to the readout circuit and configured to calculate bright values of each of the sampled second photodiodes by subtracting the outputted and stored bright values from the outputted and stored double bright values, respectively.

9. The image sensor according to claim 8,
   wherein the photodiode sampler is further configured to control the pair of pixels to output, in parallel, sampled dark values of each of the pair of pixels before outputting the respective bright values and double bright values, and
   wherein the pixel output calculator is further configured to calculate the outputted bright values of each of the sampled second photodiodes by subtracting respectively the outputted dark value and the outputted bright values of the respective first photodiode from the sampled double bright value of the first and second photodiodes of the sampled first and second photodiodes in the pixel, respectively.

10. The image sensor according to claim 8, wherein the respective sampled first and second photodiodes of the pair of pixels are sampled during a single clock cycle.

11. The image sensor according to claim 8, further comprising a readout circuit controller configured to transmit control signals to the plurality of switches in the readout circuit such that at least a pair of the plurality of storage capacitors alternately store and output the sampled bright value and the sampled double bright value of at least one of the pair of pixels.

12. The image sensor according to claim 11, wherein the readout circuit includes at least another pair of capacitors configured to sample a reference voltage.

13. The image sensor according to claim 12, wherein the readout circuit controller is further configured to control the plurality of switches of the column readout circuit to output voltage differentials between the sampled reference voltage and each of the sampled bright value and the sampled double bright value, respectively.

14. The image sensor according to claim 8, wherein the pixel array comprises a plurality of pixels in a column configuration, with each pixel comprising four photodiodes.

15. The image sensor according to claim 14, wherein the photodiode sampler is further configured to activate a plurality of transistors in the pair of the pixels, to control two photodiodes of the pair of pixels to be sampled during each clock cycle.

16. The image sensor according to claim 8, further comprising a plurality of analog-to-digital converters coupled to the readout circuit and configured to generate respective digital signals from the calculated bright values to generate a corresponding image to be displayed on an electronic display device.

17. An image sensor with parallel readout of pixels to minimize output bandwidth during pixel sampling, the image sensor comprising:
a photodiode sampler configured to double sample at least two pixels in a pixel array to generate respective bright values of at least first and second photodiodes of each of the at least two pixels;
a pixel array output controller configured to control the at least two pixels to output the generated bright values in parallel without resetting the at least two pixels; and
an image signal generator configured to generate an image to be displayed on a display device based on the generated and outputted bright values,
wherein the photodiode sampler is further configured to control the at least two pixels to output, in parallel without resetting the at least two pixels, respective bright values of sampled first photodiodes of each of the at least two pixels and respective double bright values that combine the sampled first photodiodes with sampled second photodiodes of each of the at least two pixels.

18. The image sensor according to claim 17, further comprising a bright value calculator configured to calculate bright values for each of the sampled second photodiodes of the at least two pixels by subtracting the outputted bright values from the outputted double bright values, respectively.

19. The image sensor according to claim 18, wherein the photodiode sample is further configured to control the at least two pixels in the pixel array to output in parallel to a readout circuit, the respective bright values of sampled first photodiodes and the respective double bright values combining the sampled first photodiodes with sampled second photodiodes, in consecutive order during a single clock cycle without resetting the at least two pixels.

20. The image sensor according to claim 19, further comprising the readout circuit that includes a plurality of storage capacitors selectively coupled to the pixel array by a plurality of switches, wherein the plurality of storage capacitors are configured to store the outputted bright values and double bright values, respectively.

21. The image sensor according to claim 20,
wherein the photodiode sampler is further configured to control the at least two pixels to output, in parallel, sampled dark values of each of the at least two pixels before outputting the respective bright values and double bright values, and
wherein the pixel output calculator is further configured to calculate the outputted bright values of each of the sampled second photodiodes by subtracting respectively the outputted dark value and the outputted bright values of the respective first photodiode from the sampled double bright value of the sampled first and second photodiodes in the pixel, respectively.

22. The image sensor according to claim 20, further comprising a readout circuit controller configured to transmit control signals to the plurality of switches in the readout circuit such that at least a pair of the plurality of storage capacitors alternately store and output the sampled bright value and the sampled double bright value of at least one of the at least two pixels.

23. The image sensor according to claim 22, wherein the readout circuit includes at least another pair of capacitors configured to sample a reference voltage.

24. The image sensor according to claim 23, wherein the readout circuit controller is further configured to control the plurality of switches of the column readout circuit to output voltage differentials between the sampled reference voltage and each of the sampled bright value and the sampled double bright value, respectively.

25. The image sensor according to claim 17, wherein the pixel array comprises a plurality of pixels in a column configuration, with each pixel comprising four photodiodes.

26. The image sensor according to claim 25, wherein the photodiode sampler is further configured to activate a plurality of transistors in the at least two pixels, to control two photodiodes of the at least two pixels to be sampled during each clock cycle.

27. The image sensor according to claim 17, further comprising a plurality of analog-to-digital converters coupled to the readout circuit and configured to generate respective digital signals from the calculated bright values to generate the image configured to be displayed on the display device.

* * * * *